United States Patent
Wang et al.

(10) Patent No.: US 10,280,078 B2
(45) Date of Patent: May 7, 2019

(54) ELECTROMECHANICAL DEVICE INCLUDING CONNECTOR FORMED OF DIELECTRIC MATERIAL

(71) Applicants: Semiconductor Manufacturing International (Shanghai) Corporation, Shanghai (CN); Semiconductor Manufacturing International (Beijing) Corporation, Beijing (CN)

(72) Inventors: Wei Wang, Shanghai (CN); Chao Zheng, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 113 days.

(21) Appl. No.: 15/352,795

(22) Filed: Nov. 16, 2016

(65) Prior Publication Data
US 2017/0197826 A1    Jul. 13, 2017

(30) Foreign Application Priority Data
Jan. 8, 2016    (CN) .......................... 2016 1 0011755

(51) Int. Cl.
*B81B 7/00*    (2006.01)
*B81C 1/00*    (2006.01)

(52) U.S. Cl.
CPC ........ *B81C 1/00801* (2013.01); *B81B 7/0025* (2013.01); *B81B 2201/0257* (2013.01);
(Continued)

(58) Field of Classification Search
CPC .......... B81C 1/00801; B81C 2201/053; B81C 2201/0133; B81B 7/0025;
(Continued)

(56) References Cited

U.S. PATENT DOCUMENTS 7,888,754 B2 * 2/2011 Omura ................. B81B 3/0021
                                                        257/419
9,349,644 B2 * 5/2016 Katsumata .......... B81C 1/00095
(Continued)

FOREIGN PATENT DOCUMENTS

WO    2013071952    5/2013

OTHER PUBLICATIONS

EP Search Report corresponding to EP Application No. 16207261.5, dated May 11, 2017, 8 pages.

*Primary Examiner* — Mohsen Ahmadi
*Assistant Examiner* — Scott E Bauman
(74) *Attorney, Agent, or Firm* — Innovation Counsel LLP

(57) ABSTRACT

An electromechanical device may include a first substrate, a second substrate, a connector, and a protector. The connector may be formed of a first dielectric material and may be positioned between the first substrate and the second substrate. A first side of the connector may directly contact the first substrate. The protector may be formed of a second dielectric material and may directly contact a second side of the connector.

16 Claims, 8 Drawing Sheets

(52) U.S. Cl.
CPC ............... *B81B 2203/0307* (2013.01); *B81B 2203/0315* (2013.01); *B81C 2201/0133* (2013.01); *B81C 2201/053* (2013.01)

(58) Field of Classification Search
CPC .... B81B 2203/0315; B81B 2203/0307; B81B 2201/0257
USPC ........................................................ 257/415
See application file for complete search history.

(56) References Cited

U.S. PATENT DOCUMENTS

2001/0029060 A1   10/2001  Fukada et al.
2002/0158039 A1*  10/2002  Harris ................ B81C 1/00484
                                                           216/2
2010/0002895 A1*   1/2010  Notake ................ B81B 3/0051
                                                           381/174
2014/0264651 A1*   9/2014  Dehe .................. B81C 1/00182
                                                           257/416
2018/0201500 A1*   7/2018  Zheng ................. B81B 3/0086

* cited by examiner

US 10,280,078 B2

ELECTROMECHANICAL DEVICE INCLUDING CONNECTOR FORMED OF DIELECTRIC MATERIAL

CROSS-REFERENCE TO RELATED APPLICATION

This application claims priority to and benefit of Chinese Patent Application No. 201610011755.0, filed on 8 Jan. 2016; the Chinese Patent Application is incorporated herein by reference in its entirety.

BACKGROUND OF THE INVENTION

The technical field is related to an electromechanical device, e.g., a microelectromechanical system (MEMS) device, a method for manufacturing the electromechanical device, and an electronic device that includes the electromechanical device.

Electromechanical devices, e.g., microelectromechanical system (MEMS) devices, may be utilized in various electronic devices, such as printers, sensors, and display devices. An electromechanical device may include a first substrate, a second substrate, and one or more anchors (or connectors) connected between the first substrate and the second substrate for maintaining relative positions of the first substrate and the second substrate. During the manufacturing of the electromechanical device, the anchor(s) may be significantly damaged, e.g., because of over-etching. As a result, performance and/or reliability of the electromechanical device may be unsatisfactory.

SUMMARY

An embodiment may be related to an electromechanical device, e.g., a microelectromechanical system (MEMS) device. The electromechanical device may include a first substrate (e.g., first semiconductor substrate), a second substrate (e.g., second semiconductor substrate), a first connector (or first anchor), and a first-connector protector (or first-anchor protector). The first connector may be formed of a first dielectric material and may be positioned between the first substrate and the second substrate. A first side of the first connector may directly contact the first substrate. The first-connector protector may be formed of a second dielectric material and may directly contact a second side of the first connector. The second side of the first connector may not be parallel to the first side of the first connector.

The first side of the first connector may directly contact a first side of the first substrate. A first side of the first-connector protector may directly contact the second side of the first connector and may directly contact a second side of the first substrate.

The second side of the first connector may be coplanar with the second side of the first substrate.

A first side of the second substrate may directly contact a second side of the first-connector protector and may directly contact a third side of the first connector. The third side of the first connector may be parallel to the first side of the first connector.

The electromechanical device may include a through-hole protector, which may be formed of the second dielectric material. The first substrate may have a through hole. The through-hole protector may be positioned inside the through hole. The through-hole protector may surround a hollow channel. The through-hole protector may be shorter than the first-connector protector in a direction perpendicular to the first side of the first connector.

The electromechanical device may include a first conductor and two opposite protectors. The first conductor may be formed of an electrically conductive material and may directly contact the first substrate. The two opposite protectors may be formed of the second dielectric material, may be spaced from the first-connector protector, may directly contact the first substrate, and may respectively directly contact two opposite sides of the first conductor.

The first substrate may be positioned between the first connector and at least one of the two opposite protectors. The electromechanical device may include a second conductor and two spaced protectors. The second conductor may be formed of the electrically conductive material and may directly contact the second substrate. The two spaced protectors may be formed of the second dielectric material, may be spaced from the first-connector protector, may directly contact the second substrate, and may respectively directly contact two opposite sides of the second conductor.

The electromechanical device may include a second connector and a second-connector protector. The second connector may be formed of the first dielectric material, may be positioned between the first substrate and the second substrate, and may be positioned between the first connector and the second conductor. A first side of the second connector may directly contact the first substrate. The second-connector protector may be formed of the second dielectric material, may directly contact a second side of the second connector, and may be positioned between the second connector and at least one of the two spaced protectors.

A flat side of the second substrate may directly contact each of the first side of the second connector, the second-connector protector, the second conductor, and the two spaced protectors.

A flat side of the first substrate may directly contact each of the first side of the first connector, the first-connector protector, the first conductor, and the two opposite protectors.

The electromechanical device may include a second connector and a second-connector protector. The second connector may be formed of the first dielectric material, may be positioned between the first substrate and the second substrate, and may be spaced from the first connector. A first side of the second connector may directly contact the first substrate. The second-connector protector may be formed of the second dielectric material and may directly contact a second side of the second connector. The first connector and the second connector may be positioned between the first-connector protector and the second-connector protector.

Both the first connector and the second connector directly contact a first side of the first substrate. The first-connector protector may directly contact a second side of the first substrate. The second-connector protector may directly contact a third side of the first substrate. The second side of the first substrate may be opposite the third side of the first substrate.

Both the first-connector protector and the second-connector protector may directly contact a first side of the second substrate.

An embodiment may be related to a method for manufacturing an electromechanical device, e.g., a microelectromechanical system (MEMS) device. The method may include the following steps: preparing a first substrate (e.g., first semiconductor substrate); preparing a second substrate (e.g., second semiconductor substrate); preparing a first connector, which may be formed of a first dielectric material and may be positioned between the first substrate and the second substrate, wherein a first side of the first connector may directly contact the first substrate; and preparing a first-connector protector, which may be formed of a second dielectric material and may directly contact a second side of the first connector.

The method may include the following steps: preparing a connector material layer between the first substrate and a substrate material member, wherein the first substrate may have a through hole; providing protectors, which may include the first-connector protector and a through-hole protector, wherein the through-hole protector may be positioned inside the through hole and may surround a hollow channel; processing the substrate material member to form the second substrate; and partially removing the connector material layer through at least the hollow channel to form the first connector.

The method may include providing a protector material layer, which may directly contact each of the first substrate, the connector material layer, and the substrate material member. A first portion of the protector material layer may be positioned inside the through hole. A bottom portion of the first portion of the protector material layer may directly contact the connector material layer. The method may include removing the bottom portion of the first portion of the protector material layer for forming the through-hole protector. The processing of the substrate material member may be performed after the through-hole protector has been formed.

The method may include the following steps: providing a protector material layer, which may include a first protector material portion, a second protector material portion, and a third protector material portion. The first protector material portion may directly contact a top side of the first substrate. The second protector material portion may directly contact a top side of the substrate material member. The third protector material portion may directly contact a top side of the connector material layer. The method may include removing the first protector material portion, the second protector material portion, and the third protector material portion for forming the first-connector proctor and the through-hole protector. The processing of the substrate material member may be performed after the first-connector protector and the through-hole protector have been formed.

According to embodiments, a connector (or anchor) in an electromechanical device may be sufficiently protected during the manufacturing of the electromechanical device. Therefore, the connector may function effectively and reliably. Advantageously, satisfactory reliability and/or performance of the electromechanical device may be attained.

The above summary is related to some of many embodiments of the invention disclosed herein and is not intended to limit the scope of the invention.

BRIEF DESCRIPTION OF THE DRAWINGS

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, and FIG. 1O show schematic diagrams (e.g., schematic cross-sectional views) that illustrate elements and/or structures formed in a method for manufacturing an electromechanical device in accordance with one or more embodiments.

FIG. 1O shows a schematic diagram (e.g., a schematic cross-sectional view) that illustrates elements and/or structures in an electromechanical device in accordance with one or more embodiments.

DETAILED DESCRIPTION

Figure 1A:
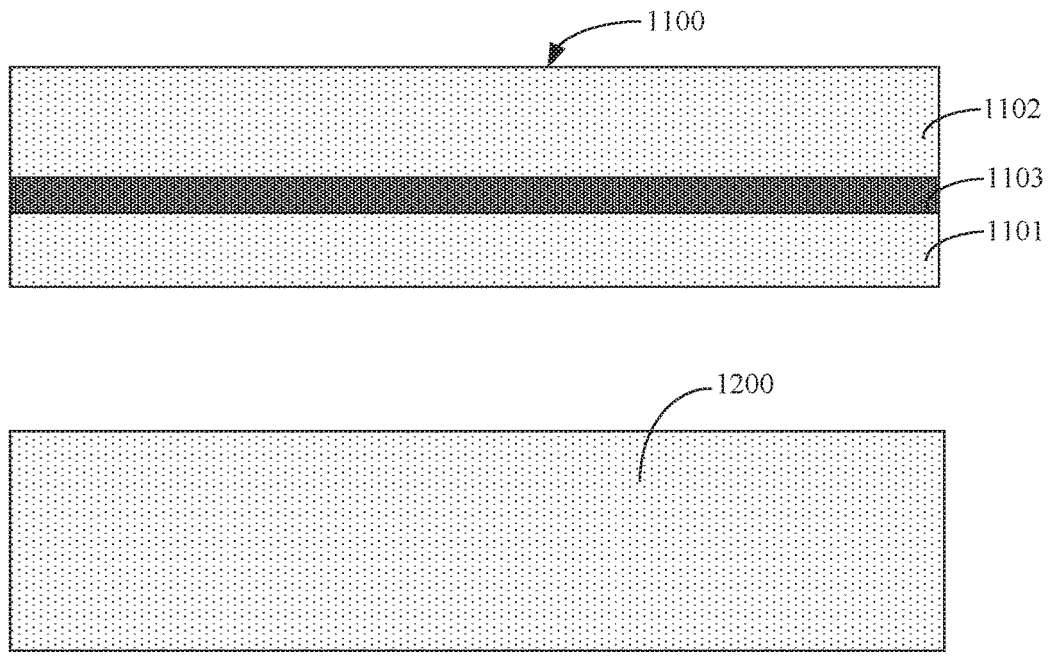

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "mechanically connect", "electrically connect", "directly connect", or "indirectly connect". The term "insulate" may mean "electrically insulate". The term "conductive" may mean "electrically conductive". The term "electrically connected" may mean "electrically connected without any intervening transistors". If a component (e.g., a transistor) is described as (electrically) connected between a first element and a second element, then a source/drain/input/output terminal of the component may be electrically connected to the first element through no intervening transistors, and a drain/source/output/input terminal of the component may be electrically connected to the second element through no intervening transistors.

The term "conductor" may mean "electrically conductive member". The term "insulator" may mean "electrically insulating member". The term "dielectric" may mean "dielectric member". The term "interconnect" may mean "interconnecting member". The term "prepare", the term "provide", or the term "form" may mean "prepare, provide, and/or form". The term "side" may mean "flat side", "planar side", or "straight side".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, and FIG. 1O show schematic diagrams (e.g., schematic cross-sectional views) that illustrate elements and/or structures formed in a method for manufacturing an electromechanical device in accordance with one or more embodiments. FIG. 1O shows a schematic diagram (e.g., a schematic cross-sectional view) that illustrates elements and/or structures in the electromechanical device in accordance with one or more embodiments. FIG. 2 shows a flowchart that illustrates steps in a method for manufacturing the electromechanical device in accordance with one or more embodiments. The method may include steps S201, S202, S203, S204, S205, S206, S207, S208, S209, S210, S211, S212, S213, and S214.

Referring to FIG. 2 and FIG. 1A, the step S201 may include preparing a substrate material layer 1100 and substrate material layer 1200. The substrate material layer 1100 may be/include a semiconductor substrate material layer. The substrate material layer 1100 may be/include at least one of a silicon layer, a silicon-on-insulator (SOI) layer, a stacked silicon-on-insulator (SOI) layer, a stacked silicon germanium-on-insulator (S—SiGeOI) layer, a silicon germanium-on-insulator (SiGeOI) layer, a germanium-on-insulator (GeOI) layer, etc. The substrate material layer 1100 may include a silicon layer 1101, a silicon layer 1102, and an insulator (e.g., an oxide layer) positioned between the silicon layer 1101 and the silicon layer 1102. The substrate material layer 1200 may be/include a semiconductor substrate material layer, e.g., a silicon layer.

Figure 1B:
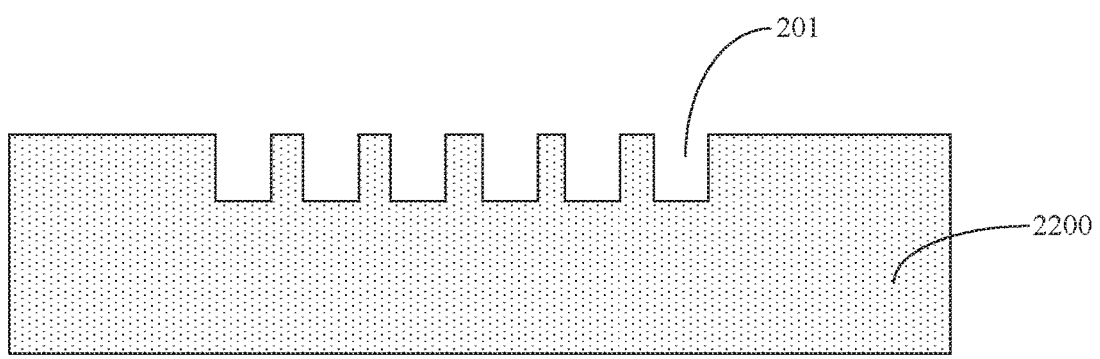
Figure 2:
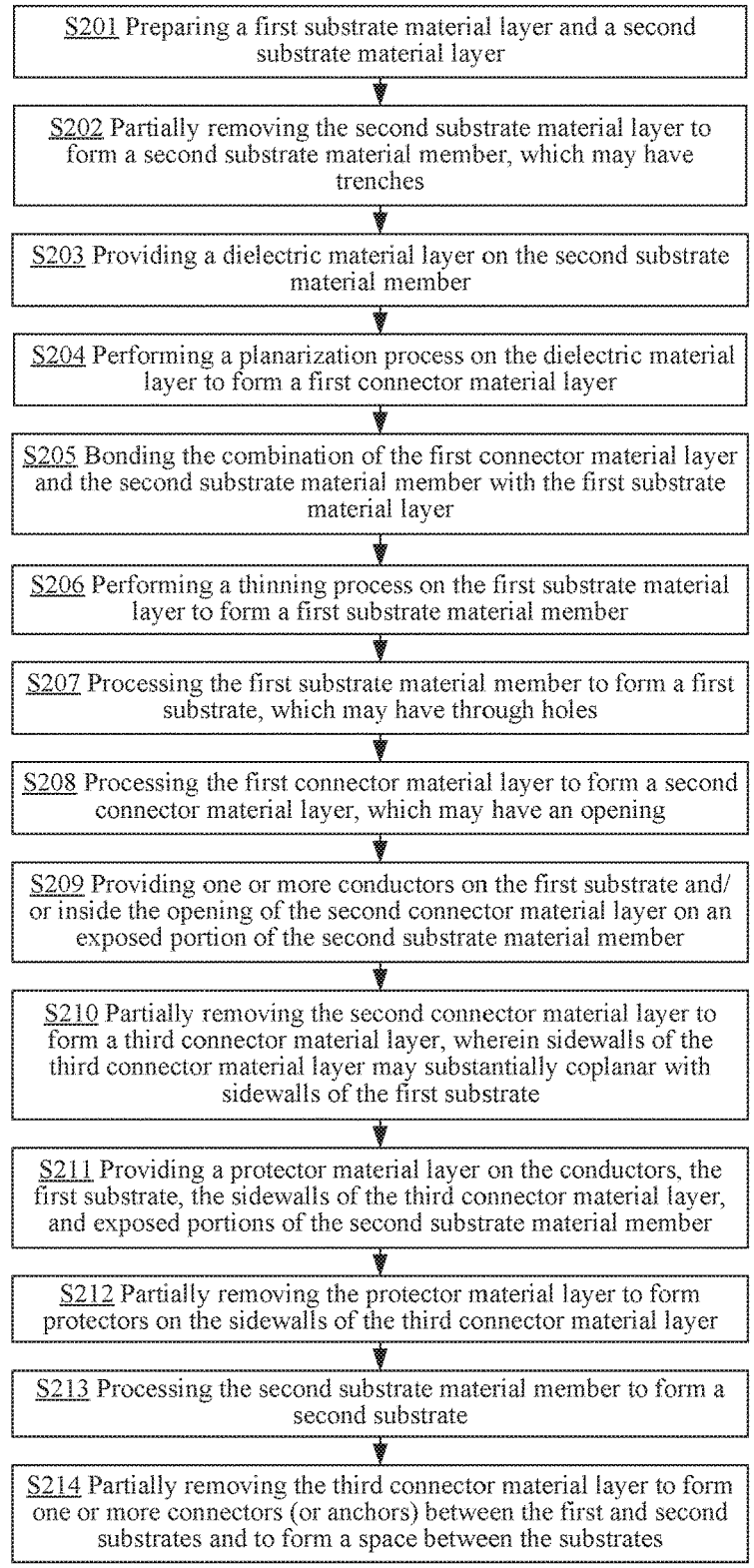
FIG. 2 shows a flowchart that illustrates steps in a method for manufacturing an electromechanical device in accordance with one or more embodiments.

Referring to FIG. 2, FIG. 1A, and FIG. 1B, the step S202 may include partially removing the substrate material layer 1200 to form a substrate material member 2200, which may have trenches, including a trench 201. The step S202 may include the following steps: providing a photoresist on the substrate material layer 1200; patterning the photoresist using a lithography process to form a mask; etching (e.g., using a wet etching process and/or a dry etching process) the substrate material layer 1200 through the mask for partially removing the substrate material layer 1200 to form the substrate material member 2200 with the trenches 201; and removing the mask. The dry etching process may include at least one of a reactive ion etching (RIE) process, an ion beam etching process, a plasma etching process, a laser ablation process, etc.

Figure 1C:
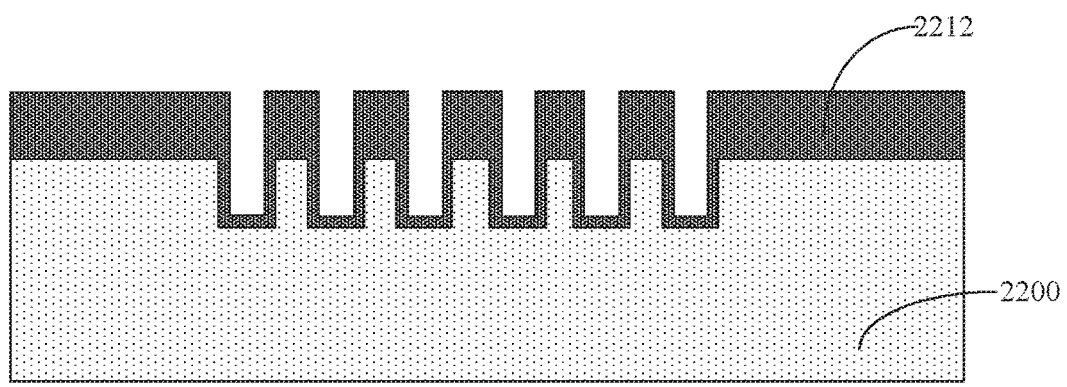

Referring to FIG. 2, FIG. 1B, and FIG. 1C, the step S203 may include providing a dielectric material layer 2212 on the substrate material member 2200. Portions of the dielectric material layer 2212 may be positioned inside the trenches 201 may cover sidewalls and bottoms of the trenches 201. The dielectric material layer 2212 may be formed of at least one of silicon oxide, silicon nitride, silicon oxide, amorphous carbon, etc., such as silicon oxide. The dielectric material layer 2212 may be formed using at least one of a chemical vapor deposition process, an atomic layer deposition process, etc., such as a plasma chemical vapor deposition process. A thickness of the dielectric material layer 2212 may be in a range of 30 microns to 60 microns.

Figure 1D:
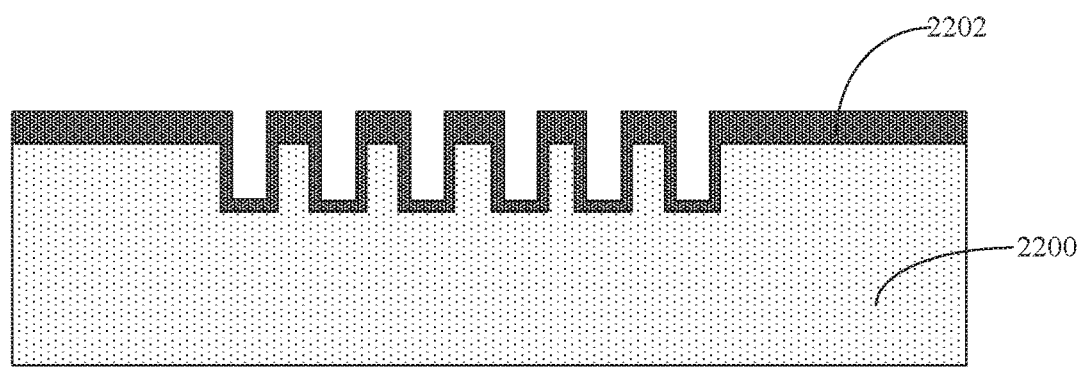

Referring to FIG. 2, FIG. 1C, and FIG. 1D, the step S204 may include performing a planarization process on the dielectric material layer 2212 to form a connector material layer 2202 (or anchor material layer 2202), which may also function as a sacrificial layer in one or more subsequent steps. The connector material layer 2202 may have a flat top surface and may have a thickness that is less than a thickness of the dielectric material layer 2212. The planarization process may include at least one of a mechanical planarization process, a chemical-mechanical planarization process, etc.

Figure 1E:
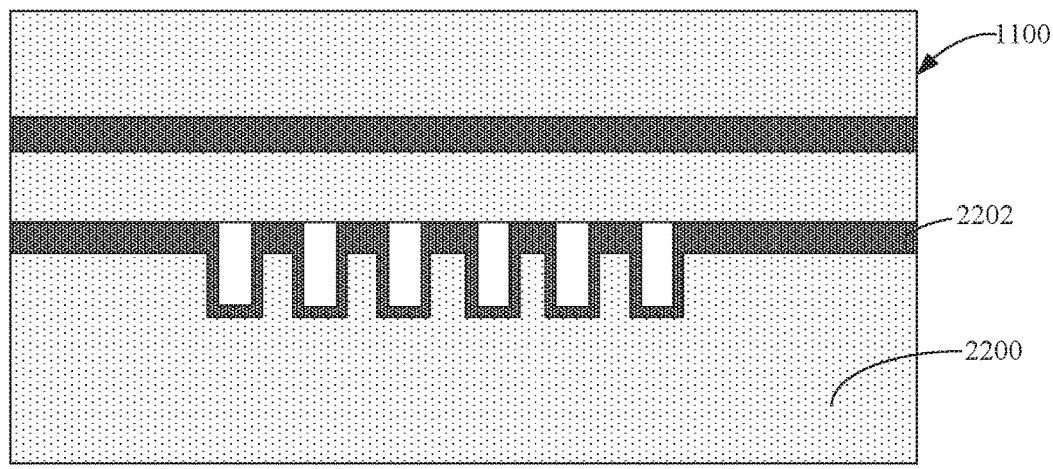

Referring to FIG. 2, FIG. 1D, and FIG. 1E, the step S205 may include bonding (e.g., using a fusion bonding process) the combination of the connector material layer 2202 and the substrate material member 2200 with the substrate material layer 1100, such that the connector material layer 2202 may be positioned between the substrate material member 2200 and the substrate material layer 1100.

Figure 1F:
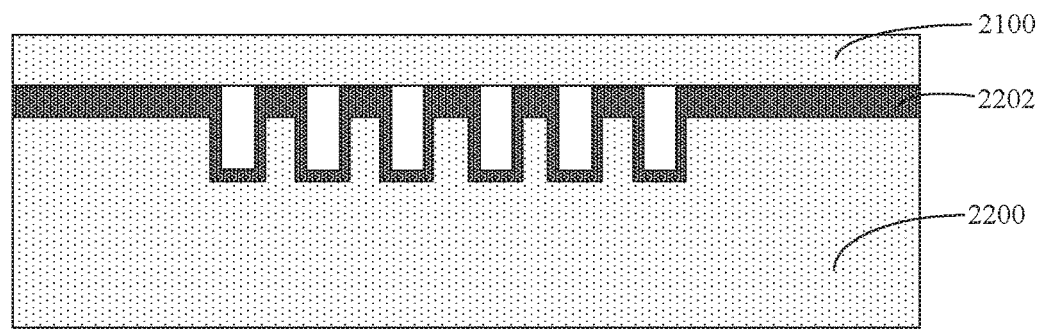
Figure 1G:
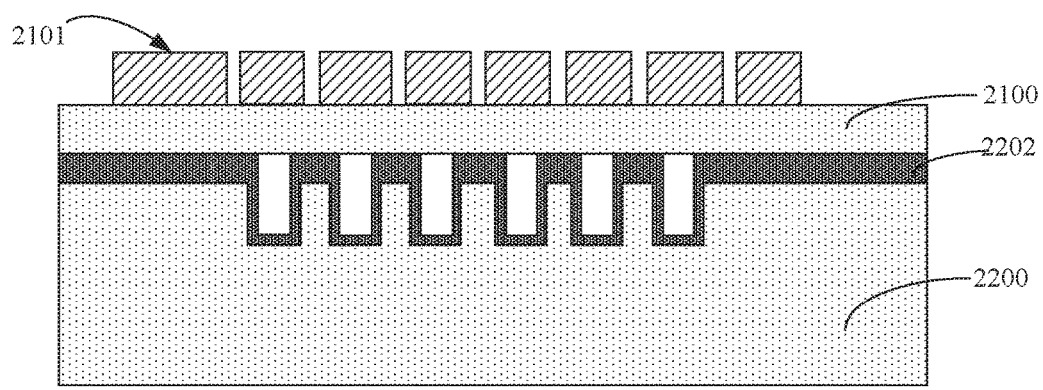
Figure 1H:
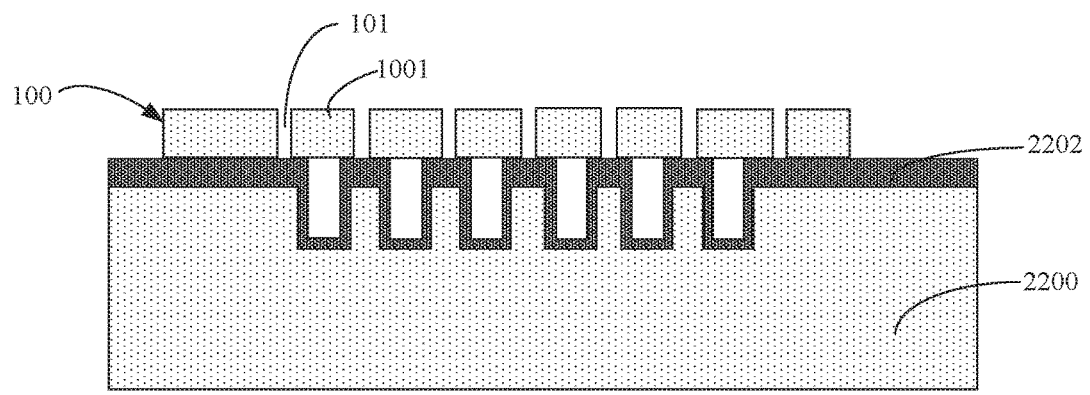
Figure 1I:
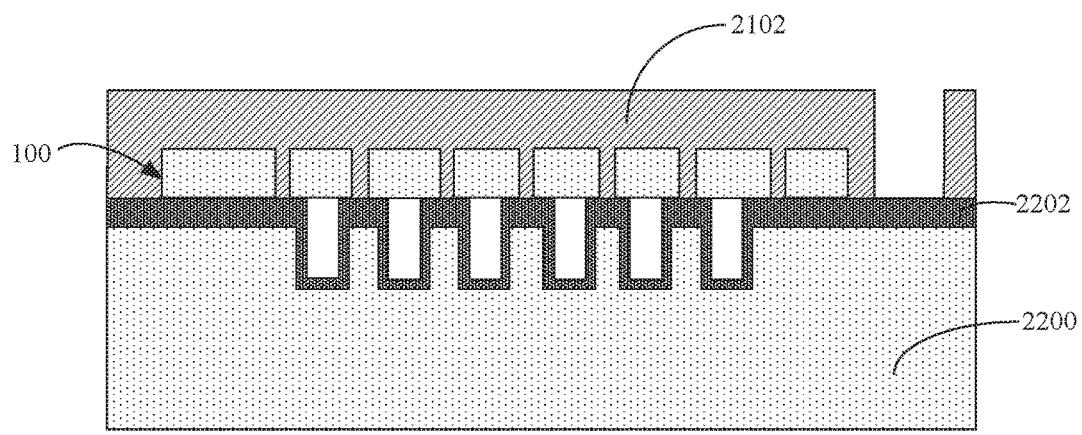

Referring to FIG. 2, FIG. 1E, and FIG. 1F, the step S206 may include performing a thinning process on the substrate material layer 1100 to form a substrate material member 2100. A thickness of the substrate material member 2100 may be less than a thickness of the substrate material layer 1100 and may satisfy requirements of one or more particular embodiments. The thinning process may be performed on an exposed side of the substrate material layer 1100. The exposed side of the substrate material layer 1100 may be opposite a side of the substrate material layer 1100 that directly contacts the connector material layer 2202. The thinning process may include at least one of a chemical mechanical planarization process, an etching process, etc.

Referring to FIG. 2, FIG. 1F, FIG. 1G, and FIG. 1H, the step S207 may include processing the substrate material member 2100 to form a substrate 100, which may have through holes, including a through hole 101, and may function as an electrode. The through holes may expose portions of the connector material layer 2202. The through holes may be positioned between substrate portions (including substrate portion 1001) of the substrate 100 in a cross-sectional view of the substrate 100. The step S207 may include the following steps: providing a photoresist on the substrate material member 2100; patterning (e.g., using a lithography process) the photoresist to form a mask 2101; partially removing the substrate material member 2100 through the mask 2101 to form the substrate 100; and removing the mask 2101. The substrate material member 2100 may be partially removed using at least one of a dry etching process, a wet etching process, etc. The dry etching process may be/include at least one of a reactive ion etching (RIE) process, an ion beam etching process, a plasma etching process, a laser cutting process, a laser ablation process, etc. The mask 2101 may be removed using at least one of a wet etching process, an ashing process, a lift-off process, etc.

Referring to FIG. 2, FIG. 1H, FIG. 1I, and FIG. 1J, the step S208 may include processing the connector material layer 2202 to form a connector material layer 2212, which may have an opening 203 corresponding to a position and/or a dimension of a conductor to be subsequently formed. The step S208 may include the following steps: providing a patterned photoresist 2102 on the substrate 100 and the connector material layer 2202, wherein the patterned photoresist 2102 has an opening that defines the position and/or the dimension of the conductor to be subsequently formed and exposes a portion of the connector material layer 2202; removing (e.g., using an etching process) the exposed portion of the connector material layer 2202 through the opening using the patterned photoresist 2102 as a mask to form the connector material layer 2212 with the opening 203; and removing the patterned photoresist 2102. The patterned photoresist 2102 may be removed using at least one of a wet etching process, an ashing process, a lift-off process, etc.

Figure 1J:
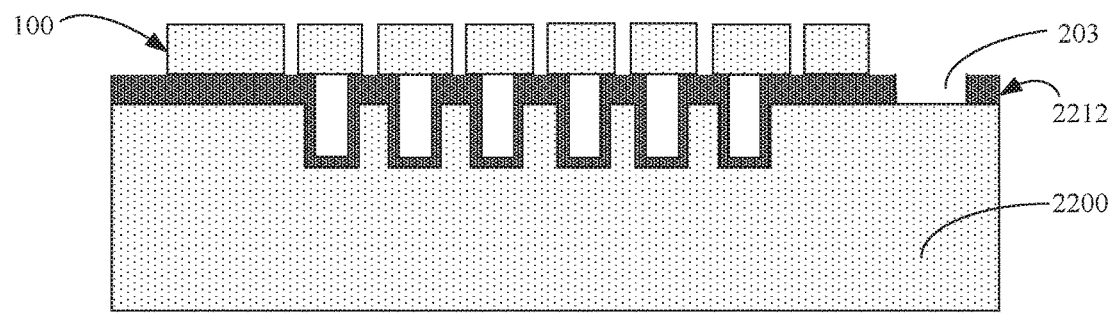
Figure 1K:
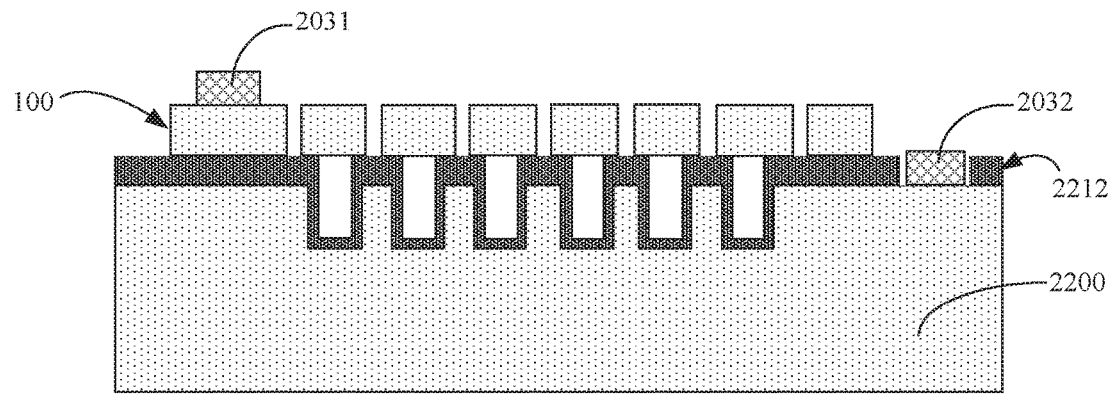

Referring to FIG. 2, FIG. 1J, and FIG. 1K, the step S209 may include providing one or more conductors, e.g., a conductor 2031 and a conductor 2032, on the substrate 100 and/or inside the opening 203 of the connector material layer 2212 on an exposed portion of the substrate material member 2200 that is exposed by the opening 203. The step S209 may include the following steps: providing (e.g., using a deposition process) an electrically conductive material layer on the substrate 100, the connector material layer 2212, and the exposed portion of the substrate material member 2200; patterning (or partially removing) the electrically conductive material layer to form the conductor 2031 (which may be positioned on the substrate 100) and the conductor 2032 (which may be positioned inside the opening 203 and may directly contact the substrate material member 2200). The electrically conductive material layer, the conductor 2031, and the conductor 2032 may be formed of an electrically conductive material, such as a metal material. The metal material may be/include at least one of aluminum, copper, gold, silver, platinum, tin, etc., such as aluminum. The electrically conductive material layer may be formed using at least one of a low-pressure chemical vapor deposition (PECVD) process, a plasma-enhanced chemical vapor deposition (PECVD), process, a metal organic chemical vapor deposition (MOCVD) process, an atomic layer deposition (ALD) process, etc. The electrically conductive material layer may be patterned using at least one of a lithography process and an etching process for forming the conductors 2031 and 2032.

Figure 1L:
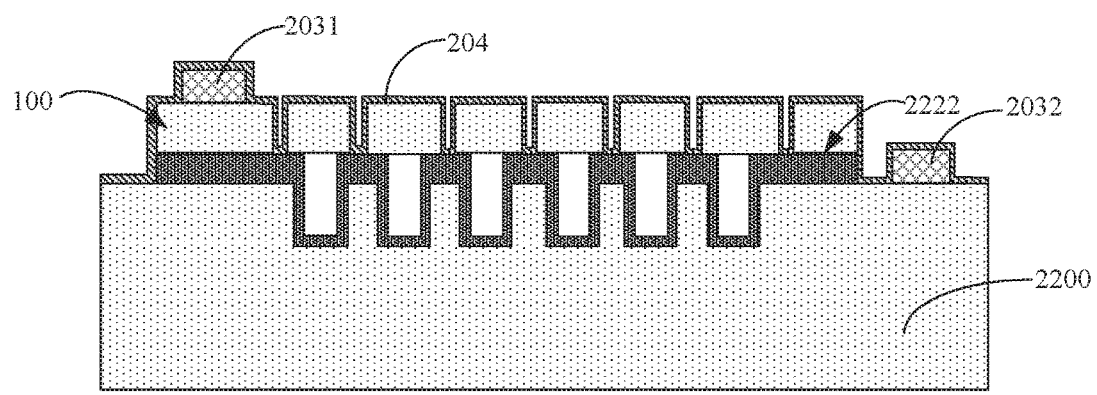

Referring to FIG. 2, FIG. 1K and FIG. 1L, the step S210 may include partially removing (e.g., using an etching process) the connector material layer 2212 to form a connector material layer 2222, wherein sidewalls of the connector material layer 2222 may substantially coplanar with sidewalls of the substrate 100.

Referring to FIG. 2, FIG. 1K, and FIG. 1L, the step S211 may include providing a protector material layer 204 on the conductors 2031 and 2032, the substrate 100, the sidewalls of the connector material layer 2222, and exposed portions of the substrate material member 2200. The protector material layer 204 may be formed of an inorganic dielectric material that has a high wet etching selectivity ratio relative to at least one of the connector material layer 2222, the substrate 100, and the substrate material member 2200. In an embodiment, the connector material layer 2222 may be formed of a silicon oxide material, and the protector material layer 204 may be formed of at least one of a silicon nitride material, a silicon oxynitride material, etc.

Portions of the protector material layer 204 may be positioned inside through holes of the substrate 100. Bottom portions of the portions of the protector material layer 204 inside the through holes may directly contact the top side of the connector material layer 2222.

Figure 1M:
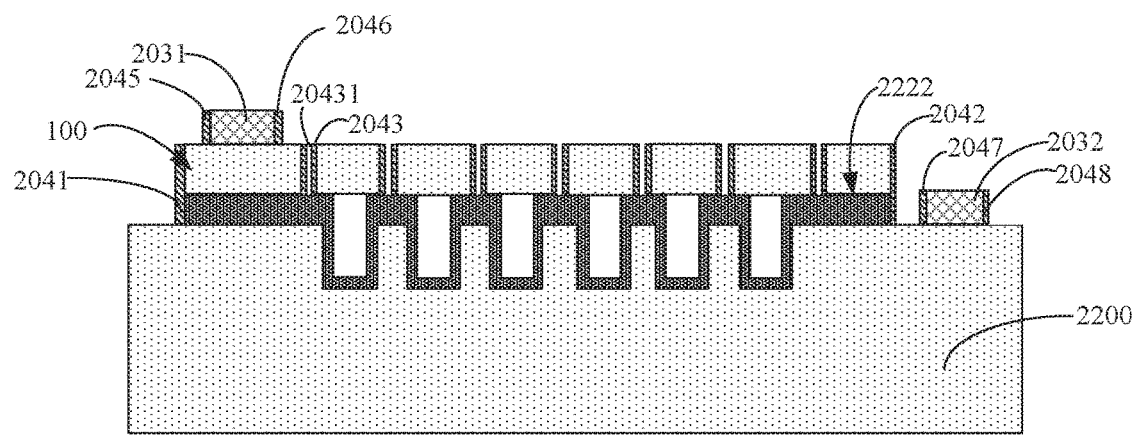

Referring to FIG. 2, FIG. 1L, and FIG. 1M, the step S212 may include partially removing (e.g., using a blank etching process) the protector material layer 204 to form protectors, which may include a connector protector 2041, a connector protector 2042, a through-hole protector 2043, two opposite protectors 2045 and 2046, and two spaced protectors 2047 and 2048 illustrated in FIG. 1M as examples. The connector protectors 2041 and 2042 may directly contact sidewalls of the connector material layer 2222. The through-hole protector 2043 may be positioned inside the through hole 101 indicated in FIG. 1H. The two opposite protectors 2045 and 2046 may directly contact two sidewalls of the conductor 2031 and/or may be two portions of a protector that surrounds the conductor 2031. The two spaced protectors 2047 and 2048 may directly contact two sidewalls of the conductor 2032 and/or may be two portions of a protector that surrounds the conductor 2032.

The step S212 may include removing a bottom portion of a portion of the protector material layer 204 inside the through hole 101 (indicated in FIG. 1H) to form the through-hole protector 2043. The through-hole 2043 may surround a hollow channel 20431.

The protector material layer 204 may include a first protector material portion and a second protector material portion. The first protector material portion may directly contact the top side of the substrate 100. The second protector material portion may directly contact the top side of the substrate material member 2200. The step S212 may include removing the first protector material portion and the second protector material portion for forming the connector proctor 2041.

Figure 1N:
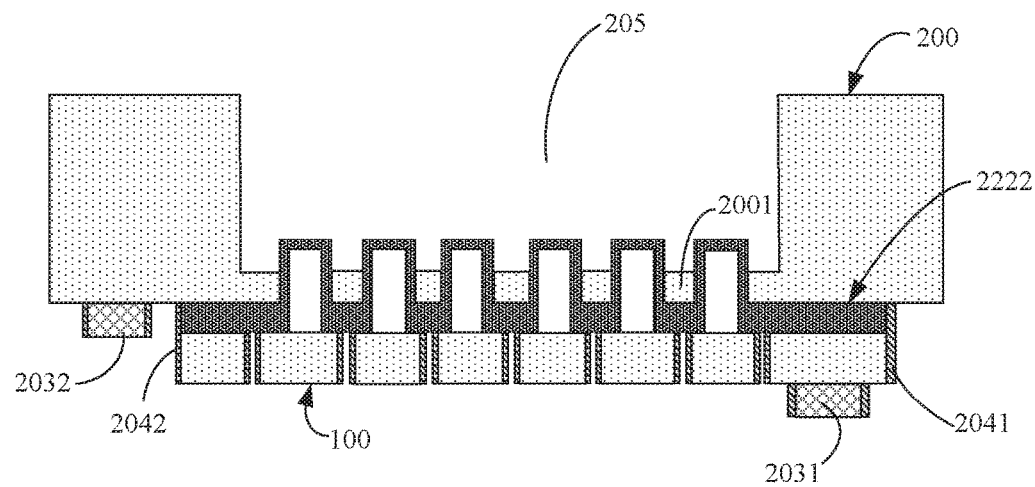
Figure 10:
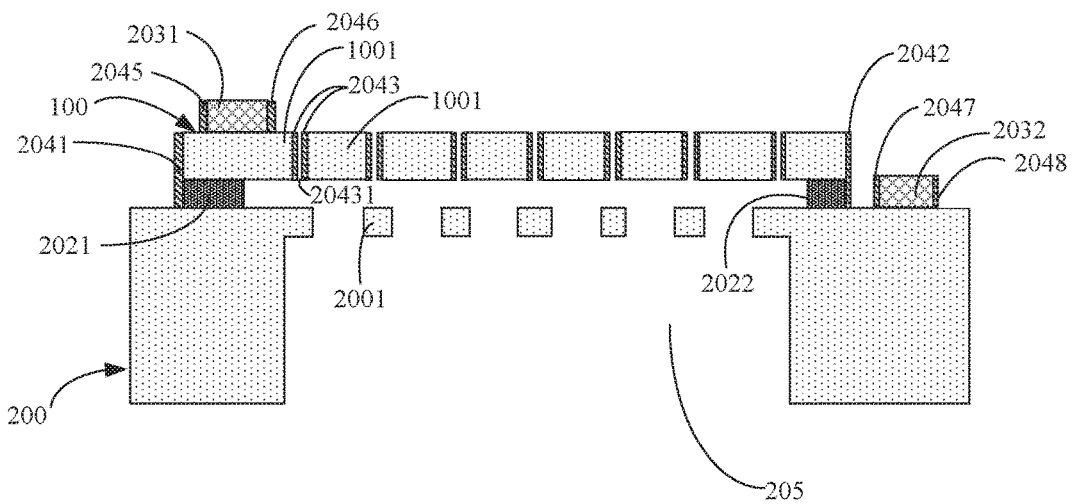

Referring to FIG. 2, FIG. 1M, and FIG. 1N, the step S213 may include processing the substrate material member 2200 to form a substrate 200. The second substrate 200 may have a cavity 205 and may include spaced substrate portions, such as a substrate portion 2001. The second substrate 200 may function as an electrode. The step S213 may include inverting the structure illustrated in FIG. 1M, i.e., inverting the combination of the substrate material member 2200, the connector material layer 2222, the substrate 100, the conductors, and the protectors; and performing an etching process on the substrate material member 2200 to form the cavity 205, which exposes portions of the connector material layer 2222, such that the substrate 200 may be formed. The etching process may be/include one or more dry etching processes, which may be/include at least one of a reactive ion etching (RIE) process, an ion beam etching process, a plasma etching process, a laser cutting process, a laser ablation process, etc.

Referring to FIG. 2, FIG. 1N, and FIG. 1O, the step S214 may include partially removing the connector material layer 2222 to form one or more connectors (or anchors), e.g., connectors 2021 and 2022 (or anchors 2021 and 2022), between the substrates 100 and 200 and to form a space between substrate portions of the substrate 100 (including the substrate portion 1001) and substrate portions of the substrate 200 (including the substrate portion 2001). The connectors 2021 and 2022 may facilitate maintaining relative positions of the substrates 100 and 200 in the electromechanical device. In the step S214, the connector material layer 2222 may function as a sacrificial layer for forming the space between the substrates 100 and 200.

In the step S214, the connector material layer 2222 may be partially removed using a wet etching process, which may have a high selectivity ratio for the connector material layer 2222 with respect to the substrate 100, the substrate 200, the conductors, and the protectors. In an embodiment, the connector material layer 2222 may be formed of a silicon oxide material, and the wet etching process may utilize a hydrofluoric acid solution, such as a buffered oxide etchant (BOE) or a buffered hydrofluoric acid (BHF) solution. The connector protectors 2041 and 2042 may effectively protect sidewalls of the connector material layer 2222, such that the connectors 2021 and 2022 may not be over-etched. Advantageously, the connectors 2021 and 2022 may reliably and effectively perform anchoring functions in the electromechanical device.

In the step S214, portions of the connector material layer 2222 may be removed through hollow channels surrounded by though-hole protectors, such as the hollow channel 20431 surrounded by the through-hole protector 2043.

The step S214 may include inverting a structure that includes the substrates 100 and 200 before or after partially removing the connector material layer 2222.

Referring to FIG. 1O, the electromechanical device may include the substrate 100 (e.g., a first semiconductor substrate), the substrate 200 (e.g., a second semiconductor substrate), the connector 2021 (or anchor 2021), and the connector protector 2041 (or anchor protector 2041). The connector 2021 may be formed of a first dielectric material and may be positioned between the substrate 100 and the substrate 200. A first side (e.g., top side) of the connector 2021 may directly contact the substrate 100. The connector protector 2041 may be formed of a second dielectric material and may directly contact a second side (e.g., left side) of the connector 2021. The second side of the connector 2021 may not be parallel to the first side of the connector 2021.

The first side of the connector 2021 may directly contact a first side (e.g., bottom side) of the substrate 100. A first side (e.g., right side) of the connector protector 2041 may directly contact the second side of the connector 2021 and may directly contact a second side (e.g., left side) of the substrate 100. The second side of the connector 2021 may be coplanar with the second side of the substrate 100.

A first side (e.g., top side) of the substrate 200 may directly contact a second side (e.g., bottom side) of the connector protector 2041 and may directly contact a third side (e.g., bottom side) of the connector 2021. The third side of the connector 2021 may be parallel to the first side of the connector 2021.

The electromechanical device may include the through-hole protector 2043, which may be formed of the second dielectric material. The substrate 100 may have the through hole 1011. The through-hole protector 2043 may be positioned inside the through hole 1011. The through-hole protector 2043 may surround the hollow channel 20431. The through-hole protector 2043 may be shorter than the connector protector 2041 in a direction perpendicular to the first side (e.g., top side) of the connector 2021.

The electromechanical device may include the conductor 2031 and the two opposite protectors 2045 and 2046. The conductor 2031 may be formed of an electrically conductive material and may directly contact the substrate 100. The two opposite protectors 2045 and 2046 may be formed of the second dielectric material, may be spaced from the connector protector 2041, may directly contact the substrate 100, and may respectively directly contact two opposite sides of the conductor 2031. The two opposite protectors 2045 and 2046 may be two portions of a protector that surrounds the conductor 2031. The substrate 100 may be positioned between the connector 2021 and at least one of the two opposite protectors 2045 and 2046.

The electromechanical device may include the conductor 2032 and the two spaced protectors 2047 and 2048. The conductor 2032 may be formed of the electrically conductive material and may directly contact the substrate 200. The two spaced protectors 2047 and 2048 may be formed of the second dielectric material, may be spaced from the connector protector 2041, may directly contact the substrate 200, and may respectively directly contact two opposite sides of the conductor 2032. The two spaced protectors 2047 and 2048 may be two portions of a protector that surrounds the conductor 2032.

The electromechanical device may include the connector 2022 and the connector protector 2042. The connector 2022 may be formed of the first dielectric material, may be positioned between the substrate 100 and the substrate 200, and may be positioned between the connector 2021 and the conductor 2032. A first side (e.g., top side) of the connector 2022 may directly contact the substrate 100. The connector protector 2042 may be formed of the second dielectric material, may directly contact a second side (e.g., right side) of the connector 2022, and may be positioned between the connector 2022 and at least one of the two spaced protectors 2047 and 2048.

A flat side of the substrate 200 may directly contact each of a bottom side of the connector 2022, a bottom side of the connector protector 2042, a bottom side of the conductor 2032, and bottom sides of the two spaced protectors 2047 and 2048.

The connector 2021 and the connector 2022 may be positioned between the connector protector 2041 and the connector protector 2042. Both the connector 2021 and the connector 2022 directly contact a first side (e.g., bottom side) of the substrate 100. The connector protector 2041 may directly contact a second side (e.g., left side) of the substrate 100. The connector protector 2042 may directly contact a third side (e.g., right side) of the substrate 100. The second side of the substrate 100 may be opposite the third side of the substrate 100. Both the connector protector 2041 and the connector protector 2042 may directly contact a first side (e.g., top side) of the substrate 200.

According to embodiments, the connector 2021 and 2022 (or anchors 2021 and 2022) may be sufficiently protected by the protectors 2041 and 2042 during the manufacturing of the electromechanical device. Therefore, the dimensions of the connectors 2021 and 2022 may substantially satisfy specification requirements, such that connectors 2021 and 2022 may function effectively and reliably. Advantageously, satisfactory reliability and/or performance of the electromechanical device may be attained.

An embodiment may be related to an electronic device. The electronic device may include an electronic component and an electromechanical device that is electrically connected to the electronic component. The electromechanical device may have the above-discussed features.

In an embodiment, the electronic device may be/include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be/include an intermediate product (e.g., a mobile phone main board) or module including a semiconductor device that may have one or more of the features and advantages discussed above.

While some embodiments have been described as examples, there are alterations, permutations, and equivalents. It should be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is intended that the following appended claims be interpreted as including all alterations, permutations, and equivalents.

What is claimed is:

1. An electromechanical device comprising:
a first substrate;
a second substrate;
a first connector, which is formed of a first dielectric material and is positioned between the first substrate and the second substrate, wherein a first side of the first connector directly contacts the first substrate;
a first-connector protector, which is formed of a second dielectric material and directly contacts a second side of the first connector; and
a through-hole protector, which is formed of the second dielectric material, wherein the first substrate has a through hole, wherein the through-hole protector is positioned inside the through hole and is separated from the first-connector protector by a portion of the first substrate, wherein a first side of the first-connector protector directly contacts the second substrate, is opposite a second side of the first-connector protector, and is positioned between the second side of the first-connector protector and the second substrate, wherein a first side of the through-hole protector is opposite a second side of the through-hole protector and is positioned between the second side of the through-hole protector and the second substrate, and wherein a flat side of the portion of the first substrate is directly connected to each of the second side of the first-connector protector and the second side of the through-hole protector.

2. The electromechanical device of claim 1, wherein the first side of the first connector directly contacts a first side of the first substrate, and wherein a third side of the first-connector protector directly contacts the second side of the first connector and directly contacts a second side of the first substrate.

3. The electromechanical device of claim 2, wherein the second side of the first connector is coplanar with the second side of the first substrate.

4. The electromechanical device of claim 2, wherein a first side of the second substrate directly contacts the first side of the first-connector protector and directly contacts a third side of the first connector.

5. The electromechanical device of claim 1, wherein the through-hole protector extends parallel to the first-connector protector.

6. The electromechanical device of claim 1, wherein the through-hole protector surrounds a hollow channel.

7. The electromechanical device of claim 1, wherein the through-hole protector is shorter than the first-connector protector in a direction perpendicular to the first side of the first connector.

8. The electromechanical device of claim 1 comprising:
a second connector, which is formed of the first dielectric material, is positioned between the first substrate and the second substrate, and is spaced from the first connector, wherein a first side of the second connector directly contacts the first substrate; and
a second-connector protector, which is formed of the second dielectric material and directly contacts a second side of the second connector, wherein the first connector and the second connector are positioned between the first-connector protector and the second-connector protector.

9. The electromechanical device of claim 8, wherein both the first connector and the second connector directly contact a first side of the first substrate, wherein the first-connector protector directly contacts a second side of the first substrate, and wherein the second-connector protector directly contacts a third side of the first substrate.

10. The electromechanical device of claim 1, wherein the second side of the first-connector protector is coplanar with the second side of the through-hole protector.

11. The electromechanical device of claim 1, wherein the flat side of the portion of the first substrate is not closer to the second substrate than either of the second side of the first-connector protector and the second side of the through-hole protector.

12. An electromechanical device comprising:
a first substrate;
a second substrate;
a first connector, which is formed of a first dielectric material and is positioned between the first substrate and the second substrate, wherein a first side of the first connector directly contacts the first substrate;
a first-connector protector, which is formed of a second dielectric material and directly contacts a second side of the first connector;
a first conductor, which is formed of an electrically conductive material and directly contacts the first substrate; and
two opposite protectors, which are formed of the second dielectric material, are spaced from the first-connector protector, directly contact the first substrate, and respectively directly contact two opposite sides of the first conductor, wherein a flat side of the first substrate directly contacts each of the first side of the first connector, the first-connector protector, the first conductor, and the two opposite protectors.

13. The electromechanical device of claim 12, wherein the two opposite protectors are a first conductor-protector and a second conductor-protector, wherein the first conductor-protector is positioned between the first-connector protector and the first conductor, and wherein a portion of the flat side of the first substrate is positioned between the first-connector protector and the first conductor-protector and does not directly contact any element formed of the second dielectric material.

14. The electromechanical device of claim 12 comprising:
a second conductor, which is formed of the electrically conductive material and directly contacts the second substrate;
two spaced protectors, which are formed of the second dielectric material, are spaced from the first-connector protector, directly contact the second substrate, and respectively directly contact two opposite sides of the second conductor.

15. The electromechanical device of claim 12, wherein the two opposite protectors are a first conductor-protector and a second conductor-protector, wherein the first conductor-protector is positioned between the first-connector protector and the first conductor, and wherein the first-connector protector is positioned between the first connector and the first conductor-protector.

16. The electromechanical device of claim 12, wherein the two opposite protectors are a first conductor-protector and a second conductor-protector, wherein the second conductor-protector is positioned between the first conductor and a portion of the flat side of the first substrate, and wherein the portion of the flat side of the first substrate does not directly contact any element formed of the second dielectric material.

* * * * *